(12) United States Patent
Kong

(10) Patent No.: US 10,686,108 B2
(45) Date of Patent: Jun. 16, 2020

(54) SEMICONDUCTOR DEVICE PACKAGE

(71) Applicant: LG INNOTEK CO., LTD., Seoul (KR)

(72) Inventor: Sung Min Kong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/345,186

(22) PCT Filed: Oct. 27, 2017

(86) PCT No.: PCT/KR2017/011979
§ 371 (c)(1),
(2) Date: Apr. 25, 2019

(87) PCT Pub. No.: WO2018/080224
PCT Pub. Date: May 3, 2018

(65) Prior Publication Data
US 2019/0288168 A1 Sep. 19, 2019

(30) Foreign Application Priority Data
Oct. 27, 2016 (KR) .......................... 10-2016-0141323

(51) Int. Cl.
*H01L 33/60* (2010.01)
*H01L 33/50* (2010.01)
(Continued)

(52) U.S. Cl.
CPC .............. *H01L 33/60* (2013.01); *H01L 33/48* (2013.01); *H01L 33/50* (2013.01); *H01L 33/58* (2013.01);
(Continued)

(58) Field of Classification Search
CPC ......... H01L 33/60; H01L 33/48; H01L 33/50; H01L 33/58; H01L 33/62; H01L 33/10; H01L 33/405
See application file for complete search history.

(56) References Cited

U.S. PATENT DOCUMENTS

| | | | |
|---|---|---|---|
| 8,137,999 B2 * | 3/2012 | Wang | H01L 33/486 257/E21.499 |
| 2003/0075724 A1 * | 4/2003 | Wang | H01L 33/62 257/99 |

(Continued)

FOREIGN PATENT DOCUMENTS

| KR | 10-2007-0117684 | 12/2007 |
|---|---|---|
| KR | 10-2008-0060114 | 7/2008 |

(Continued)

OTHER PUBLICATIONS

International Search Report (with English Translation) and Written Opinion dated Feb. 2, 2018 issued in Application No. PCT/KR2017/011979.

*Primary Examiner* — Karen Kusumaker
(74) *Attorney, Agent, or Firm* — Ked & Assocaites, LLP

(57) ABSTRACT

Disclosed is a semiconductor device package according to an embodiment, the semiconductor comprising: a substrate; first and second lead frames arranged on the substrate; a semiconductor device electrically connected to the first and second lead frames; a reflective layer arranged on the substrate so as to reflect the light emitted from the semiconductor device; and a lens arranged on the substrate so as to cover the semiconductor device, the reflective layer, and the first and second lead frames.

15 Claims, 4 Drawing Sheets

(51) Int. Cl.
- *H01L 33/58* (2010.01)
- *H01L 33/62* (2010.01)
- *H01L 33/48* (2010.01)
- *H01L 33/10* (2010.01)
- *H01L 33/40* (2010.01)

(52) U.S. Cl.
CPC .............. *H01L 33/62* (2013.01); *H01L 33/10* (2013.01); *H01L 33/405* (2013.01)

(56) References Cited

U.S. PATENT DOCUMENTS

| | | | |
|---|---|---|---|
| 2005/0189626 A1* | 9/2005 | Xiaochun | H01L 23/49562 257/666 |
| 2008/0128724 A1* | 6/2008 | Isobe | H01L 33/62 257/98 |
| 2009/0296367 A1 | 12/2009 | Sekine et al. | |
| 2013/0126926 A1 | 5/2013 | Sakai et al. | |
| 2016/0308104 A1 | 10/2016 | Sasaoka et al. | |

FOREIGN PATENT DOCUMENTS

| | | |
|---|---|---|
| KR | 10-2010-0003318 | 1/2010 |
| KR | 10-2013-0056193 | 5/2013 |

\* cited by examiner

SEMICONDUCTOR DEVICE PACKAGE

CROSS-REFERENCE TO RELATED PATENT APPLICATIONS

This application is a U.S. National Stage Application under 35 U.S.C. § 371 of PCT Application No. PCT/KR2017/011979, filed Oct. 27, 2017, which claims priority to Korean Patent Application No. 10-2016-0141323, filed Oct. 27, 2016 whose entire disclosures are hereby incorporated by reference.

TECHNICAL FIELD

Embodiments relate to a semiconductor device package.

BACKGROUND ART

A light emitting diode (LED) is one of semiconductor devices that emit light when a current is applied thereto. The LED is capable of emitting light with high efficiency at a low voltage to have an effect of significant energy saving. Recently, a luminance problem of the LED has been significantly improved, and thus the LED is being applied to various devices such as backlight units of liquid crystal display devices, electronic sign boards, indicators, home appliances, and the like.

The light emitting diode may have a structure in which a first electrode and a second electrode are disposed on one side of a light emitting structure including a first semiconductor layer, an active layer, and a second semiconductor layer. Further, the first electrode and the second electrode may be electrically connected to an external circuit through lead frames.

However, the lead frames disposed below the LED are each made of a metal material such as gold (Au) and there is a problem in that the metal material absorbs light to degrade a light flux. In order to solve the above problem, when the lead frame is coated with silver (Ag) or the like, there is problem in that a surface of the lead frame is discolored and thus reliability is degraded.

DISCLOSURE

Technical Problem

Embodiments are directed to providing a semiconductor device package with an improved light flux.

Further, the embodiments are directed to providing a semiconductor device package capable of controlling a directivity angle.

Technical Solution

One aspect of the present invention provides a semiconductor device package including a substrate, first and second lead frames disposed on the substrate, a semiconductor device electrically connected to the first and second lead frames, a reflective layer disposed on the substrate and configured to reflect light emitted from the semiconductor device, and a lens disposed on the substrate and configured to cover the semiconductor device, the reflective layer, the first and second lead frames.

The first lead frame may include a first lead electrode portion electrically connected to the semiconductor device, an edge portion disposed on an edge of the substrate, and an extension configured to connect the edge portion to the first lead electrode portion.

The reflective layer may be disposed inside the edge portion.

The semiconductor device package may include a first pad electrically connected to the first lead frame and a second pad electrically connected to the second lead frame.

The semiconductor device package may include a first through electrode configured to pass through the substrate in a thickness direction thereof to electrically connect the first lead frame to the first pad and a second through electrode configured to pass through the substrate in the thickness direction thereof to electrically connect the second lead frame to the second pad.

A lead electrode portion of each of the first and second lead frames may be connected to an electrode pad for a Zener diode.

The edge portion may surround a second lead electrode portion of the second lead frame.

The lens may include a convex portion disposed on a central portion of the lens and a flat portion configured to surround the convex portion.

The semiconductor device package may include a dam portion disposed between the substrate and the flat portion.

The dam portion may have one surface close to the semiconductor device and the other surface opposite to the one surface, and the one surface may have a curvature and the other surface may have a flat surface.

The dam portion may be connected to the reflective layer.

The reflective layer may cover a side surface of the semiconductor device.

A thickness of the reflective layer decreases farther away from the semiconductor device.

The semiconductor device package may include a wavelength conversion layer disposed on the semiconductor device.

Advantageous Effects

In accordance with the embodiments, a light flux can be improved.

Further, a directivity angle can be controlled.

Various beneficial advantages and effects of the present invention are not limited by the above description and should be easily understood through a description of detailed embodiments of the present invention.

MODES OF THE INVENTION

Exemplary embodiments may be modified in other forms or various embodiments may be combined with each other, and the scope of the present invention is not limited to each embodiment described below.

Although an item described in a specific embodiment is not described in another embodiment, unless otherwise described in another embodiment or as long as there is no contradictory description therein, the item may be understood as being related to another embodiment.

For example, when a feature for a configuration A is described in a specific embodiment and a feature for a configuration B is described in another embodiment, even when an embodiment in which the configuration A and the configuration B are combined is not explicitly described, unless otherwise described in the embodiment or as long as there is no contradictory explanation therein, it should be understood that they will fall within the scope of the present invention.

In the description of the embodiments, when an element is described as being formed "on" or "under" another element, the term "on" or "under" includes the meaning of the two components bring in direct contact with each other (directly) and the meaning of one or more still other components being disposed and formed between the two components (indirectly). Further, when an element is described as being formed "on" or "under" another element, the description may include the meaning of the element being formed in an upward direction of another element and formed in a downward direction of another element.

Hereinafter, exemplary embodiments of the present invention will be fully described in detail so that the exemplary embodiments are suitable for implementation by those skilled in the art to which the present invention pertains with reference to the accompanying drawings.

Figure 1:
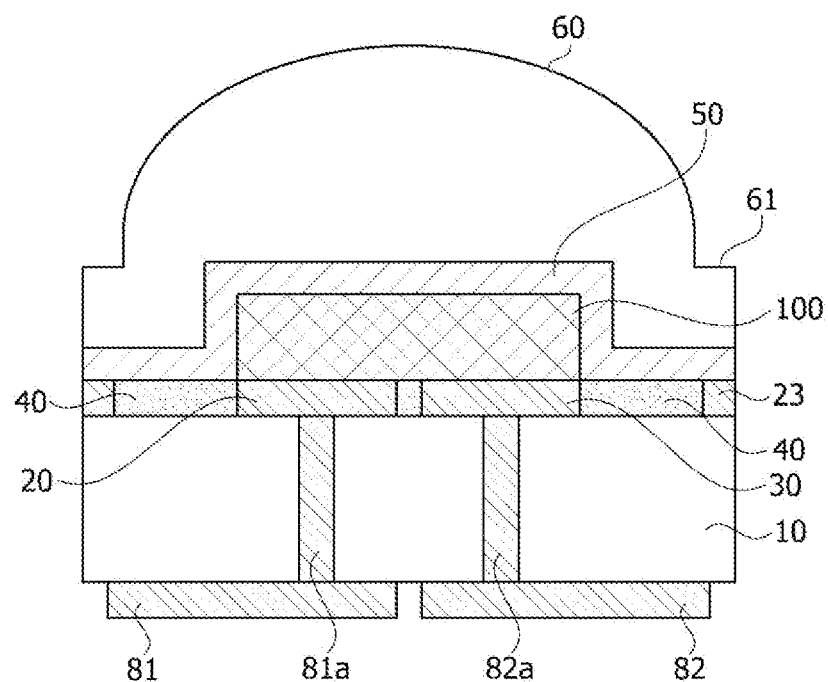
FIG. 1 is a conceptual diagram of a semiconductor device package according to one embodiment of the present invention.
Figure 2:
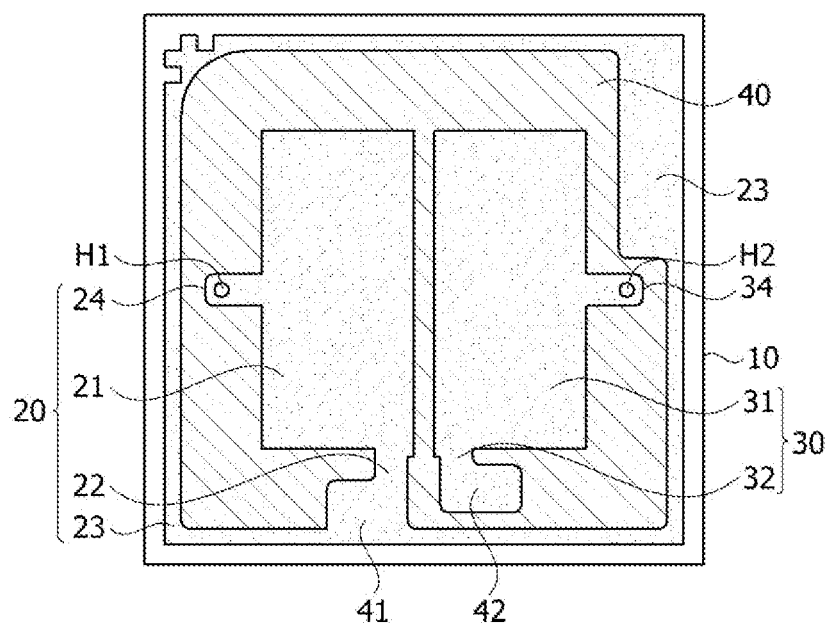
FIG. 2 is a plan view illustrating a structure of a lead frame of FIG. 1.

FIG. 1 is a conceptual diagram of a semiconductor device package according to one embodiment of the present invention, and FIG. 2 is a plan view illustrating a structure of a lead frame of FIG. 1.

Referring to FIG. 1, a semiconductor device package according to the embodiment includes a substrate 10, first and second lead frames 20 and 30 disposed on the substrate 10, a reflective layer 40 disposed on the substrate 10, a semiconductor device 100 electrically connected to the first and second lead frames 20 and 30, a wavelength conversion layer 50 disposed on the semiconductor device 100, and a lens 60 disposed above the substrate 10 and configured to cover the semiconductor device 100 and the first and second lead frames 20 and 30.

The substrate 10 may be an insulating substrate, but the present invention is not limited thereto. For example, the substrate 10 may be a ceramic insulating substrate of a nitride or an oxide. The substrate 10 may be formed of SiO2, SixOy, Si3N4, SixNy, SiOxNy, Al2O2, AlN, or the like, but the present invention is not limited thereto.

Each of the first and second lead frames 20 and 30 includes a conductive material, e.g., copper (Cu), gold (Au), or the like having high conductivity, but the present invention is not limited thereto. Alternatively, when each of the first and second lead frames 20 and 30 includes a reflective material such as aluminum (Al), light emitted from the semiconductor device 100 may be reflected to the lens 60.

However, when the lead frames are each made of Cu or Au, there is a problem in that reflection efficiency is relatively reduced.

The first and second lead frames 20 and 30 may be electrically separated from each other and connected to first and second electrodes (not shown) of the semiconductor device 100, respectively. In particular, shapes of the first and second lead frames 20 and 30 are not limited to those shown in the drawings and may be easily changed.

A first pad 81 electrically connected to the first lead frame 20 and a second pad 82 electrically connected to the second lead frame 30 may be disposed below the substrate 10. A first through electrode 81a may pass through the substrate 10 in a thickness direction thereof to electrically connect the first lead frame 20 to the first pad 81. Further, a second through electrode 82a may pass through the substrate 10 in the thickness direction thereof to electrically connect the second lead frame 30 to the second pad 82. The semiconductor device 100 may be disposed on the substrate 10 to be electrically connected to the first and second lead frames 20 and 30. The semiconductor device 100 may have a vertical type structure, a flip chip type structure, or the like, but the present invention is not limited thereto. For example, when the semiconductor device 100 has a flip chip structure, the semiconductor device 100 may be directly connected to the first and second lead frames 20 and 30 without wires.

The reflective layer 40 may have a structure in which reflective particles are dispersed in an insulating base material. The base material may be one or more among a light-transmitting epoxy resin, a silicone resin, a polyimide resin, a urea resin, and an acrylic resin. For example, the polymer resin may be a silicone resin. The reflective particles may include particles such as TiO2 or SiO2.

The reflective layer 40 may be disposed on the substrate 10 to reflect light emitted from the semiconductor device 100. Therefore, light extraction efficiency and light flux of the package can be improved. The reflective layer 40 may be disposed to surround each of the first lead frame 20 and the second lead frame 30. Accordingly, the reflective layer 40 may be disposed between the first lead frame 20 and the second lead frame 30.

The wavelength conversion layer 50 may convert a wavelength of light emitted from the semiconductor device 100. For example, the wavelength conversion layer 50 may convert the light emitted from the semiconductor device 100 into white light. The wavelength conversion layer 50 may be made of a polymer resin in which a phosphor or a quantum dot is dispersed. The kind of the phosphor is not particularly limited. The phosphor may include any one among an yttrium-aluminum-garnet (YAG)-based phosphor, a Tb3Al5O12 (TAG)-based phosphor, a silicate-based phosphor, a sulfide-based phosphor, and a nitride-based phosphor.

The wavelength conversion layer 50 may be disposed on an upper surface and side surfaces of the semiconductor device 100 and may also be disposed on top of the reflective layer 40.

The lens 60 may be made of a light-transmitting resin so as to allow light emitted from the semiconductor device 100 to be output to the outside. As shown in the drawing, the lens 60 may be formed in a convex dome-shaped structure so as to improve a directivity angle of light emitted from the package, but the present invention is not limited thereto, and the lens 60 may be formed in various shapes.

The lens 60 may be directly formed on the substrate 10 through a molding method, such as a compression molding method or a transfer molding method, or a potting method using a dispenser. Alternatively, the lens 60 may be manufactured through a separate process and attached to the substrate 10 through an adhesive.

The lens 60 may include a convex portion disposed on the semiconductor device 100 and include a flat portion 61 disposed on an outer circumferential surface of the convex portion and configured to cover an edge of the substrate 10. That is, a portion that does not relatively affect an optical characteristic may be processed to be flat to improve reliability of the package. The flat portion 61 may have a ring shape in a plan view.

Referring to FIGS. 1 and 2, a pattern may be formed on each of the first and second lead frames 20 and 30 by forming a metal layer and then selectively etching the metal layer. The first lead frame 20 may include a first lead electrode portion 21 electrically connected to the semiconductor device 100, an edge portion 23 disposed along the edge of the substrate 10, and an extension 22 which connects the edge portion 23 to the first lead electrode portion 21. The second lead frame 30 may include a second lead electrode portion 31 electrically isolated from the first lead electrode portion 21 and include a connector 32 connected to an electrode pad 42 for a Zener diode.

The edge portion 23 may be disposed on the edge of the substrate 10 to surround the first lead electrode portion 21 and the second lead frame 30. The edge portion 23 may serve to prevent the reflective layer 40 from flowing downward to the outside of the substrate 10. For example, the edge portion 23 may be electrically isolated from the first lead electrode portion 21.

The reflective layer 40 may be disposed inside the edge portion 23. Thus, the reflective layer 40 is disposed between the first lead electrode portion 21 and the second lead frame 30 so as to electrically isolate therebetween.

The first lead frame 20 may include a connector 22 connected to a first electrode pad 41 for a Zener diode, and the second lead frame 30 may include the connector 32 connected to the second electrode pad 42 for a Zener diode. The electrode pads 41 and 42 for a Zener diode may be integrally formed with the first and second lead frames 20 and 30. The first electrode pad 41 for a Zener diode may be electrically connected to the edge portion 23, whereas the second electrode pad 42 for a Zener diode may be disposed to be spaced apart from the edge portion 23.

The lead electrode portions of the first and second lead frames 20 and 30 may include protrusions 24 and 34 protruding outward. Grooves H1 and H2 formed in the protrusions 24 and 34 may be filled with the resin of the lens 60 to improve a bonding force with the lens 60.

According to the embodiment, when the metal layer is patterned to manufacture the lead electrode portion, the reflective layer 40 may be applied in the etched area to improve light extraction efficiency, while the edge portion 23 may be formed to prevent the reflective layer 40 from flowing downward to the outside of the substrate.

Figure 3:
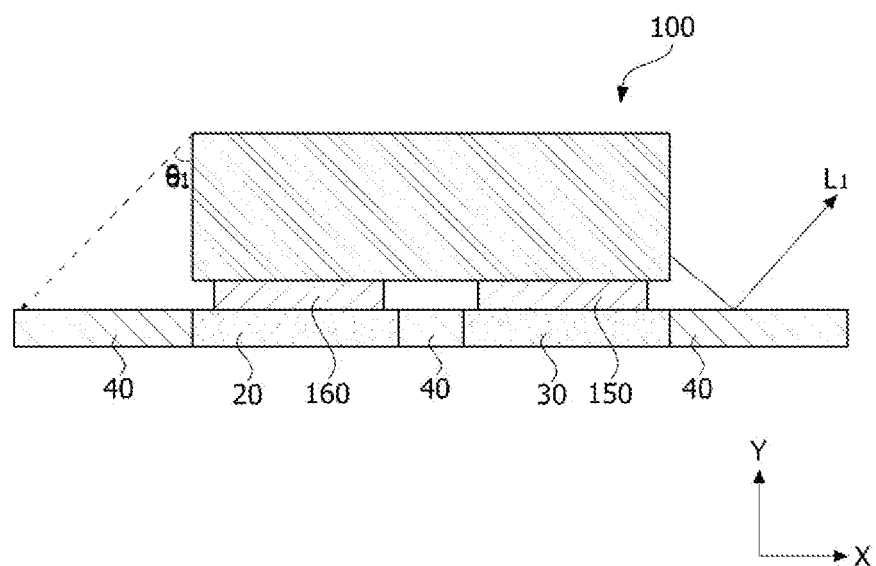
FIG. 3 is a diagram illustrating an area of a reflective layer according to a height of a semiconductor device.

FIG. 3 is a diagram illustrating an area of a reflective layer according to a height of a semiconductor device.

Referring to FIG. 3, an area of the reflective layer 40 may be varied according to a height of the semiconductor device 100. When the height of the semiconductor device 100 increases, the area of the reflective layer 40 may become wider. For example, when the height of the semiconductor device 100 is 150 μm, a first angle 61 between an imaginary line connecting an outer side of the reflective layer 40 to the upper surface of the semiconductor device 100 and the side surface of the semiconductor device 100 may be in a range of about 34 degrees to 79 degrees.

When the first angle 61 is less than or equal to 34 degrees, there is a problem in that the area of the reflective layer 40 becomes too small such that it is difficult to achieve effective light extraction efficiency. When the first angle 61 is greater than 79 degrees, there is a problem in that a package size becomes too large.

The reflective layer 40 may be disposed between the first and second lead frames 20 and 30 to reflect the emitted light downward. In this case, an area of the lead electrode portion of each of the first and second lead frames 20 and 30 may be greater than a width of each of first and second electrodes 150 and 160 of the semiconductor device 100.

Figure 4:
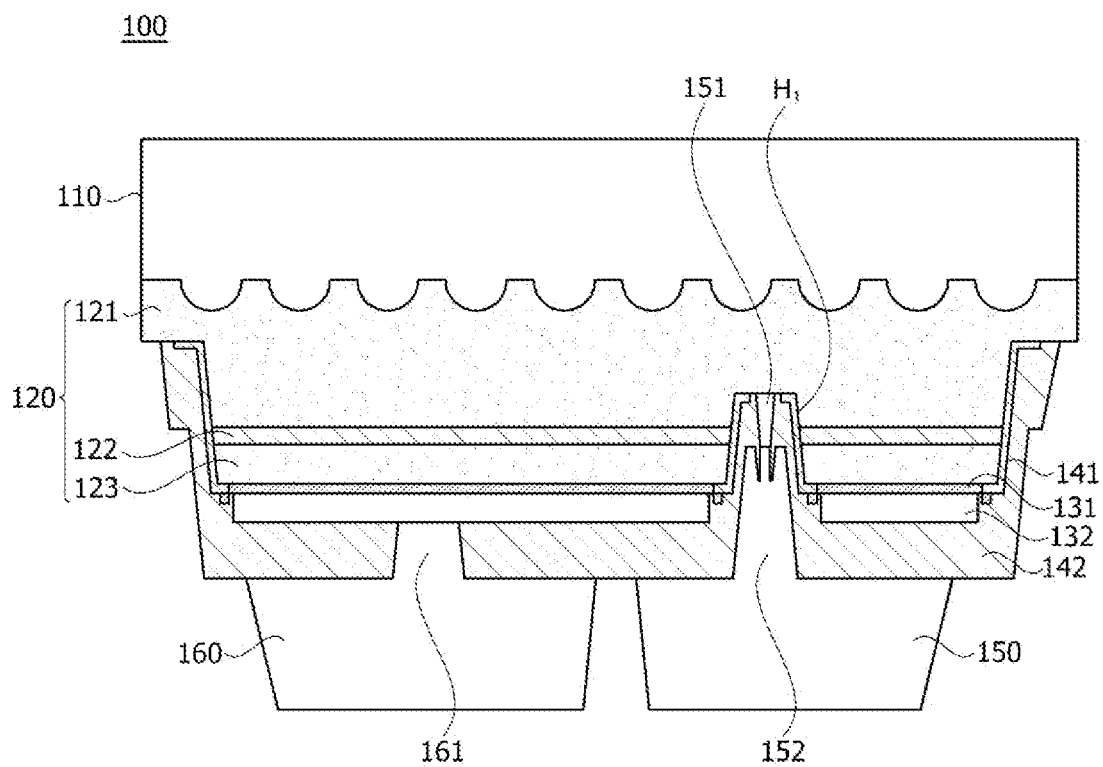
FIG. 4 is a conceptual diagram of a semiconductor device.

FIG. 4 is a conceptual diagram of a semiconductor device.

The semiconductor device 100 may include a light emitting structure 120 disposed on a substrate 110 and include a first electrode pad 150 and a second electrode pad 160 which are coupled to the light emitting structure 120.

The light emitting structure 120 includes a first conductive type semiconductor layer 121, an active layer 122, and a second conductive type semiconductor layer 123. The first conductive type semiconductor layer 121 may be formed of a Group III-V or II-VI compound semiconductor and may be doped with a first dopant.

For example, the first conductive type semiconductor layer 121 may be selected from among GaN, AlGaN, InGaN, InAlGaN, and the like which are semiconductor materials having a composition formula of $In_{x1}Al_{y1}Ga_{1-x1-y1}N$ ($0 \leq x1 \leq 1$, $0 \leq y1 \leq 1$, and $0 \leq x1+y1+1$). Further, the first dopant may be an n-type dopant such as Si, Ge, Sn, Se, or, Te. When the first dopant is an n-type dopant, the first conductive type semiconductor layer 121 doped with the first dopant may be an n-type semiconductor layer.

The active layer 122 is a layer in which electrons (or holes) injected through the first conductive type semiconductor layer 121 and holes (or electrons) injected through the second conductive type semiconductor layer 123 meet. The active layer 122 may transition to a low energy level due to the recombination of electrons and holes and emit light having a wavelength corresponding to the transition. In the present embodiment, an emission wavelength is not limited.

The active layer 122 may have any one structure among a single well structure, a multi-well structure, a single quantum well structure, a multi quantum well (MQW) structure, a quantum dot structure, and a quantum wire structure, but the structure of the active layer 122 is not limited thereto.

The second conductive type semiconductor layer 123 may be formed of a Group III-V or II-VI compound semiconductor and may be doped with a second dopant. The second conductive type semiconductor layer 123 may be formed of a semiconductor material having a composition formula of $In_{x5}Al_{y2}Ga_{1-x5-y2}N$ ($0 \leq x5 \leq 1$, $0 \leq y2 \leq 1$, and $0 \leq x5+y2 \leq 1$), or a material selected from among AlInN, AlGaAs, GaP, GaAs, GaAsP, and AlGaInP. When the second dopant is a p-type dopant such as Mg, Zn, Ca, Sr, or, Ba, the second conductive type semiconductor layer 123 doped with the second dopant may be a p-type semiconductor layer.

Although not shown in the drawing, an electron blocking layer (EBL) may be disposed between the active layer 122 and the second conductive type semiconductor layer 123. The EBL may block a flow of electrons supplied from the first conductive type semiconductor layer 121 to the second conductive type semiconductor layer 123, thereby increasing probability of recombination between the electrons and the holes in the active layer 122.

A first groove H1 may be formed in the light emitting structure 120 to pass through the second conductive type semiconductor layer 123 and the active layer 122, thereby exposing the first conductive type semiconductor layer 121. The first conductive type semiconductor layer 121 may also be partially etched due to the first groove H1. A plurality of first grooves H1 may be formed. A first ohmic electrode 151 may be disposed in the first groove H1 to be electrically connected to the first conductive type semiconductor layer 121. A second ohmic electrode 131 may be disposed below the second conductive type semiconductor layer 123.

The first ohmic electrode 151 and the second ohmic electrode 131 are each formed of one selected from among indium tin oxide (ITO), indium zinc oxide (IZO), indium zinc oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SnO, InO, INZnO, ZnO, IrOx, RuOx, NiO, Ti, Al, Ni, Cr, and a selective compound or alloy thereof and may be each formed as at least one layer. A thickness of the ohmic electrode is not particularly limited.

The first insulating layer 141 may cover one surface of the light emitting structure 120 and a side wall S of the first groove H1. The first insulating layer 141 may entirely cover the light emitting structure 120 and the first ohmic electrode 151 except for a position at which the first ohmic electrode 151 is connected to the first electrode pad 150.

The first insulating layer 141 may include an insulating material or an insulating resin which includes at least one among an oxide, a nitride, a fluoride, and a sulfide, each having at least one among Al, Cr, Si, Ti, Zn, and, Zr. For example, the first insulating layer 141 may be formed of one selected from among SiO2, Si3N4, Al2O3, and TiO2. The first insulating layer 141 may be formed as a single layer or a multilayer, but the present invention is not limited thereto.

A reflective electrode layer 132 may be disposed on the first insulating layer 141 to cover one surface of the light emitting structure 120 and the side wall S of the first groove H1. The reflective layer 40 may be entirely formed on the light emitting structure 120 except for a portion at which the first ohmic electrode 151 is connected to the first electrode pad 150. With the above-described configuration, most of the light emitted in a direction from the active layer 122 to the second conductive type semiconductor layer 123 may be reflected to the substrate 110. Thus, reflection efficiency can be increased and external quantum efficiency can be improved.

The reflective electrode layer 132 may be formed of a metallic or non-metallic material. A metallic reflective electrode layer 132 may include any one metal selected from among In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi.

A non-metallic reflective layer 40 may include a structure in which a first layer having a first refractive index and a second layer having a second refractive index are alternately stacked in two or more pairs, the first and second refractive indexes are different from each other, and the first and second layers may be each formed of a conductive or insulating material having a refractive index in a range of 1.5 to 2.4. The above-described structure may be a distributed Bragg reflection (DBR) structure. Alternatively, the above-described structure may be a structure in which a dielectric layer having a low refractive index and a metal layer are stacked (an omnidirectional reflector).

A light extraction structure, such as a roughness, may be formed on a surface of at least one of the second conductive type semiconductor layer 123 and the reflective electrode layer 132. The light extraction structure may change a critical angle of incident light to improve the light extraction efficiency. The light extracting structure may include an irregular pattern or a plurality of protrusions.

A capping electrode 133 may be disposed below the reflective electrode layer 132. The capping electrode 133 may serve as at least one of a diffusion prevention layer and a current dispersion layer or serve to protect the reflective electrode layer 132. The capping electrode 133 may be formed of one selected from among Au, Cu, Hf, Ni, Mo, V, W, Rh, Ru, Pt, Pd, La, Ta, Ti, and an alloy of two or more thereof.

A second insulating layer 142 is disposed below the capping electrode 133. The second insulating layer 142 may include an insulating material or an insulating resin which includes at least one among an oxide, a nitride, a fluoride, and a sulfide, each having at least one among Al, Cr, Si, Ti, Zn, and Zr. For example, the second insulating layer 142 may be formed of one selected from among SiO2, Si3N4, Al2O3, and TiO2. The second insulating layer 142 may be formed as a single layer or a multilayer, but the present invention is not limited thereto.

The first electrode pad 150 may be electrically connected to the first ohmic electrode 151 by passing through the second insulating layer 142. An area of the first ohmic electrode 151 increases closer to the substrate 110, whereas an area of the first electrode pad 150 decreases closer to the substrate 110.

The second electrode pad 160 may be electrically connected to the second ohmic electrode 131 and the reflective electrode layer 132 by passing through the second insulating layer 142.

The first electrode pad 150 and the second electrode pad 160 may each include any one metal selected from among In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi.

Figure 5:
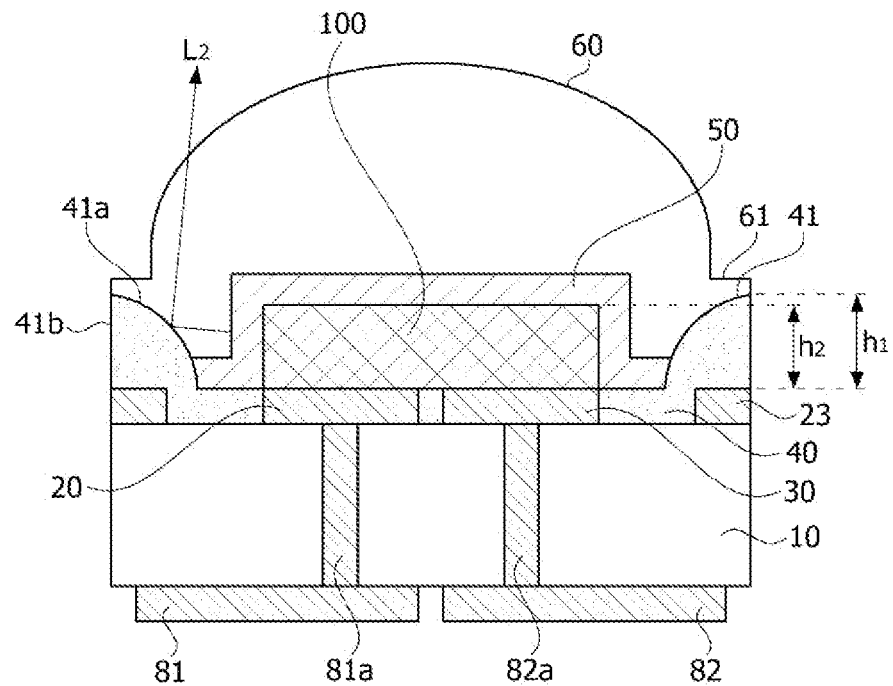
FIG. 5 is a conceptual diagram of a semiconductor device package according to another embodiment of the present invention.
Figure 6:
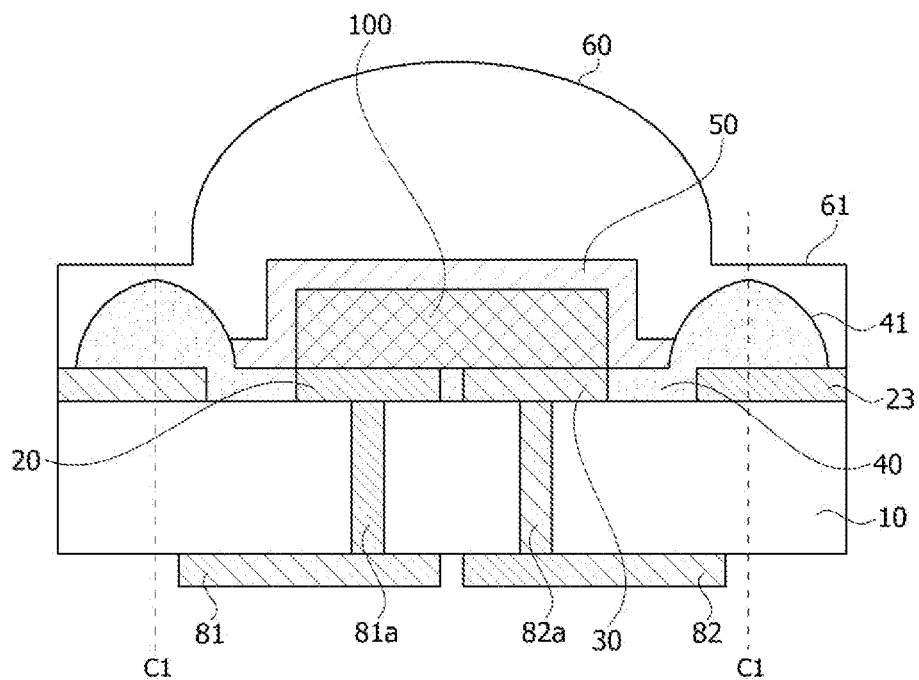
FIG. 6 is a diagram for describing a method of manufacturing the semiconductor device package according to another embodiment of the present invention.

FIG. 5 is a conceptual diagram of a semiconductor device package according to another embodiment of the present invention, and FIG. 6 is a diagram for describing a method of manufacturing the semiconductor device package according to another embodiment of the present invention.

The package according to the present embodiment may have a directivity angle that is greater than that of the existing semiconductor device package. For example, the semiconductor device package of FIG. 1 may have a directivity angle in a range of 123 degrees to 130 degrees and a light flux of 178 lm. Therefore, it is necessary to control the directivity angle so as to increase the light flux.

The semiconductor device package according to the present embodiment may include a dam portion 41 which surrounds the semiconductor device 100. The dam portion 41 may have a structure connected to the reflective layer 40, but the present invention is not limited thereto. The dam portion 41 may be disposed on the edge portion 23 of the first lead frame 20.

The dam portion 41 may have a composition that is identical to that of the reflective layer 40. For example, the dam portion 41 may have a structure in which reflective particles are dispersed in a base material. The base material may be one or more among a light-transmitting epoxy resin, a silicone resin, a polyimide resin, a urea resin, and an acrylic resin. For example, the polymer resin may be a silicone resin. The reflective particles may include particles such as TiO2 or SiO2.

The dam portion 41 may be disposed in the flat portion 61 of the lens 60. A height of the dam portion 41 may be ⅓ times to two times a height of a semiconductor device. That is, the height of the dam portion 41 may be variously adjusted to control the directivity angle. However, it may be advantageous in terms of reliability that the height of the dam portion 41 is formed to be lower than that of the flat portion 61.

The dam portion 41 may include a first surface 41a close to the semiconductor device 100, and a second surface 41b opposite to the first surface 41a. The first surface 41a may have a curvature, whereas the second surface 41b may have a flat surface. When the first surface 41a has a curvature, the light emitted from the semiconductor device 100 may be effectively reflected upward. When the dam portion 41 is formed, the directivity angle is controlled in a range of 120 degrees to 127 degrees, and the light flux is improved to 182 lm.

Referring to FIG. 6, the dam portion 41 may be formed on the edge portion 23. A cross section of the dam portion 41 may be formed in a semicircular shape. The dam portion 41 and the reflective layer 40 may be formed simultaneously, and alternatively, the reflective layer 40 may be formed and then the dam portion 41 may be formed thereon. Thereafter, a portion C1 of the edge of the substrate 10 may be cut.

Then, using a dispenser, a resin which forms the lens may be applied. In this case, the dam portion 41 may be pre-cured to maintain a shape thereof, and then the lens 60 and the dam portion 41 may be cured simultaneously. However, the present invention is not particularly limited thereto, and the dam portion 41 may be manufactured through a separate process and attached via an adhesive.

Figure 7:
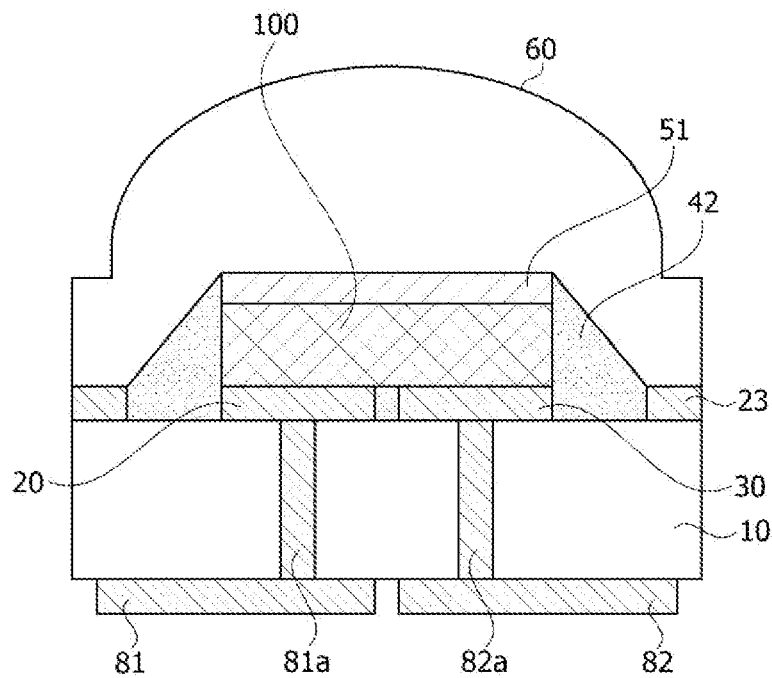
FIG. 7 is a conceptual diagram of a semiconductor device package according to still another embodiment of the present invention.
Figure 8:
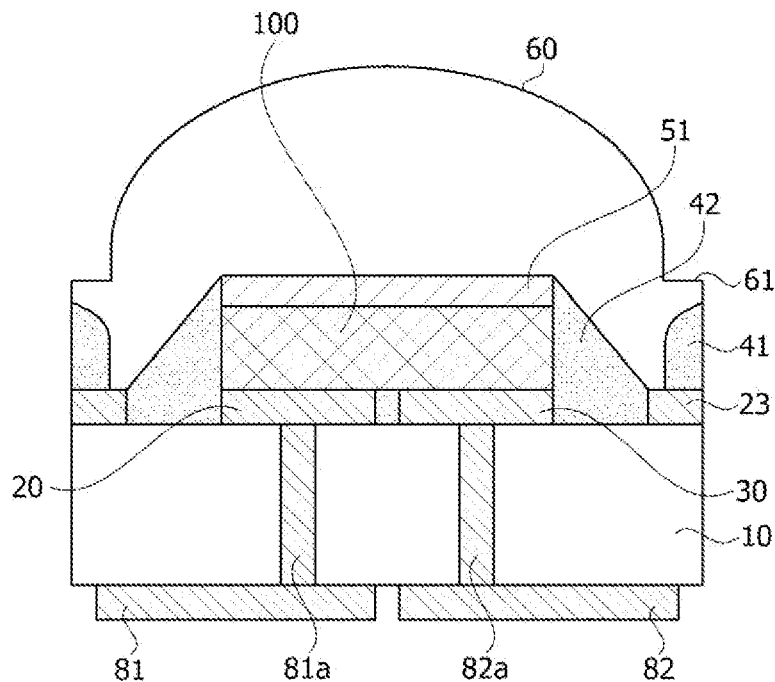
FIG. 8 is a diagram illustrating a modified example of FIG. 7.

FIG. 7 is a conceptual diagram of a semiconductor device package according to still another embodiment of the present invention, and FIG. 8 is a diagram illustrating a modified example of FIG. 7.

Referring to FIG. 7, in the above-described structure, a wavelength conversion layer may be formed on an entire upper surface by being applied through spraying. In the present embodiment, a wavelength conversion layer 51 may be manufactured in the form of a film and disposed on semiconductor device 100. When the wavelength conversion layer 51 is manufactured in the form of a film, there is an advantage in that the package can be easily manufactured and entirely uniform light can be implemented.

A reflective layer 42 may be disposed to the side surface of the semiconductor device 100. The reflective layer 42 may be disposed such that a thickness thereof decreases farther away from the side surface of the semiconductor device 100. In this case, although an inclined surface is shown as a straight line, the inclined surface may have a concave curvature due to gravity during formation of the reflective layer.

The edge portion 23 of the first lead frame 20 may prevent the reflective layer 42 from flowing downward to the outside of the substrate 10. With the above-described configuration, the reflective layer 40 may reflect light emitted to the side surface of the semiconductor device 100 to increase the light extraction efficiency and effectively control the directivity angle.

Referring to FIG. 8, a dam portion 41 may be further disposed on the edge portion 23. The dam portion 41 may be manufactured in the same manner as in the manufacturing process described with reference to FIG. 6. According to the present embodiment, the directivity angle may be controlled by the dam portion 41 and the reflective layer 40 such that the light flux may be improved.

The dam portion 41 may have a composition that is identical to that of the reflective layer 42. For example, the dam portion 41 may have a structure in which reflective particles are dispersed in a base material. The base material may be one or more among a light-transmitting epoxy resin, a silicone resin, a polyimide resin, a urea resin, and an acrylic resin. For example, the polymer resin may be a silicone resin. The reflective particles may include particles such as $TiO_2$ or $SiO_2$.

The dam portion 41 may be disposed in the flat portion 61 of the lens 60. A height of the dam portion 41 may be ⅓ times to two times a height of a semiconductor device. That is, the height of the dam portion 41 may be variously adjusted to control the directivity angle. However, it may be advantageous in terms of reliability that the height of the dam portion 41 is formed to be lower than that of the flat portion 61.

The dam portion 41 may include a first surface close to the semiconductor device 100 and a second surface opposite to the first surface. The first surface may have a curvature, whereas the second surface may have a flat surface. When the first surface has a curvature, the light emitted from the semiconductor device 100 may be effectively reflected upward.

The above-described semiconductor device package according to the embodiments of the present invention may further include an optical member such as a light guiding panel, a prism sheet, and a diffusion sheet, thereby serving as a backlight unit. Further, the semiconductor device package according to the embodiments of the present invention may be further applied to a display device, a lighting device, and an indicating device.

At this point, the display device may include a bottom cover, a reflector, a light-emitting module, a light guide plate, an optical sheet, a display panel, an image signal output circuit, and a color filter. The bottom cover, the reflector, the light-emitting module, the light guide plate, and the optical sheet may configure a backlight unit.

The reflector is disposed on the bottom cover, and the light-emitting module emits light. The light guiding panel is disposed in front of the reflector to guide the light emitted from the semiconductor device forward, and the optical sheet may include a prism sheet or the like to be disposed in front of the light guiding panel. The display panel is disposed in front of the optical sheet, the image signal output circuit supplies an image signal to the display panel, and the color filter is disposed in front of the display panel.

Further, the lighting device may include a light source module having a substrate and the semiconductor device package of the embodiments, a heat dissipation part configured to dissipate heat of the light source module, and a power supplier configured to process or convert an electrical signal provided from the outside to provide the electrical signal to the light source module. Further, the lighting device may include a lamp, a head lamp, a street lamp, or the like.

It should be understood that the present invention is not limited to the above described embodiments and the accompanying drawings, and various substitutions, modifications, and alterations can be devised by those skilled in the art to which the present invention pertains without departing from the technical spirit of the embodiments described herein.

The invention claimed is:

1. A semiconductor device package comprising:
   a substrate;
   a first lead frame and a second lead frame disposed on the substrate;
   a semiconductor device electrically connected to the first and second lead frames;
   a reflective layer disposed on the substrate and configured to reflect light emitted from the semiconductor device; and a lens disposed on the substrate and configured to cover the semiconductor device, the reflective layer, the first and second lead frames, wherein the first lead frame includes:

a first lead electrode portion electrically connected to the semiconductor device;

an edge portion extending according to an edge of the substrate and surrounding the first lead electrode portion and the second lead frame; and an extension portion configured to connect the edge portion to the first lead electrode portion.

2. The semiconductor device package of claim 1, wherein the reflective layer is disposed inside the edge portion.

3. The semiconductor device package of claim 1, comprising:

a first pad electrically connected to the first lead frame; and a second pad electrically connected to the second lead frame.

4. The semiconductor device package of claim 3, comprising:

a first through electrode configured to pass through the substrate in a thickness direction thereof to electrically connect the first lead frame to the first pad; and a second through electrode configured to pass through the substrate in the thickness direction thereof to electrically connect the second lead frame to the second pad.

5. The semiconductor device package of claim 1, wherein the first lead frame comprises a first electrode pad connecting to the first lead electrode portion and the second lead frame comprises a second electrode pad connecting to a second lead electrode portion, and wherein the first electrode pad and the second electrode pad are connected to a Zener diode.

6. The semiconductor device package of claim 5, wherein the extension portion connects the first electrode pad to the first lead electrode portion.

7. The semiconductor device package of claim 5, wherein the edge portion surrounds a second lead electrode portion and the second electrode pad.

8. The semiconductor device package of claim 1, wherein the lens includes a convex portion disposed on a central portion of the lens and a flat portion configured to surround the convex portion.

9. The semiconductor device package of claim 8, wherein the reflective layer comprises a dam portion protruding from the upper surface of the substrate, wherein the dam portion has one surface close to the semiconductor device and the other surface opposite to the one surface, and the one surface has a curvature and the other surface has a flat surface.

10. The semiconductor device package of claim 9, wherein the dam portion is overlapped with the flat portion in a vertical direction.

11. The semiconductor device package of claim 9, wherein a height of the dam portion is ⅓ times to two times of a height of a semiconductor device.

12. The semiconductor device package of claim 5, wherein a first angle between an imaginary line connecting an outer side of the reflective layer to the upper surface of the semiconductor device and the side surface of the semiconductor device is in a range of about 34 degrees to 79 degrees.

13. The semiconductor device package of claim 1, wherein the reflective layer covers a side surface of the semiconductor device.

14. The semiconductor device package of claim 8, wherein a thickness of the reflective layer decreases farther away from the semiconductor device.

15. The semiconductor device package of claim 1, comprising a wavelength conversion layer disposed on the semiconductor device, wherein the wavelength conversion layer extends to the reflective layer.

* * * * *